United States Patent
Kim et al.

(10) Patent No.: US 9,280,027 B2
(45) Date of Patent: Mar. 8, 2016

(54) LIQUID CRYSTAL DISPLAY

(71) Applicant: Samsung Display Co., Ltd., Yongin, Gyeonggi-Do (KR)

(72) Inventors: Jihye Kim, Seoul (KR); Seung-Kyu Lee, Asan-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/484,114

(22) Filed: Sep. 11, 2014

(65) Prior Publication Data
US 2015/0253602 A1  Sep. 10, 2015

(30) Foreign Application Priority Data
Mar. 6, 2014 (KR) .................. 10-2014-0026703

(51) Int. Cl.
*H01L 29/88* (2006.01)
*H01L 29/861* (2006.01)
*G02F 1/1365* (2006.01)
(Continued)

(52) U.S. Cl.
CPC ............ *G02F 1/1365* (2013.01); *G02F 1/1339* (2013.01); *G02F 1/136204* (2013.01); *H01L 27/124* (2013.01)

(58) Field of Classification Search
CPC ............... H01L 21/67126; H01L 21/67721; H01L 23/4926; H01L 25/167; H01L 27/0814; H01L 27/124; H01L 27/146; H01L 27/1463; H01L 27/14667; H01L 27/14643; H01L 29/6603; H01L 29/6609; H01L 29/66204; H01L 29/66106; H01L 29/66113; H01L 29/7391; H01L 27/1251; H01L 27/0248; H01L 27/0755; H01L 27/11898; H01L 21/31683; H01L 21/0425; H01L 21/048; H01L 21/56; H01L 23/14; H01L 23/147; H01L 23/3142

USPC ............... 257/104, 79, 15, 40, 233, 234, 292, 257/121, 570, 603, 604, 59, 288, 414, 487, 257/499, 678, 687, E21.007, E21.05, 257/E21.053, E21.084, E21.351, E21.352, 257/E21.354, E21.355, E21.356, E21.357, 257/E21.358, E21.366
See application file for complete search history.

(56) References Cited

U.S. PATENT DOCUMENTS 773,166 A *  10/1904  Choi et al. ............... 246/79
6,618,029 B1 *  9/2003  Ozawa ..................... 345/82
(Continued)

FOREIGN PATENT DOCUMENTS

KR     10-0696258 B1     3/2007
KR     10-0813004 B1     3/2008
(Continued)

*Primary Examiner* — David Nhu
(74) *Attorney, Agent, or Firm* — Knobbe, Martens, Olson & Bear, LLP

(57) ABSTRACT

A liquid crystal display is disclosed. In one aspect, the liquid crystal display includes first and second display substrates and a liquid crystal layer interposed therebetween. The liquid crystal display also includes a sealant interposed between the first and second display substrates and substantially sealing the liquid crystal layer. The sealant overlaps a gate metal portion formed on the first display substrate. The gate metal portion includes a first gate metal, a second gate metal opposing the first gate metal and spaced apart from the first gate metal, and a third gate metal spaced apart from the first and second gate metals. The gate metal portion further includes a first diode electrically connecting the first gate metal to the third gate metal and a second diode electrically connecting the second gate metal to the third gate metal.

20 Claims, 3 Drawing Sheets

(51) Int. Cl.
*G02F 1/1339* (2006.01)
*G02F 1/1362* (2006.01)
*H01L 27/12* (2006.01)

(56) References Cited

U.S. PATENT DOCUMENTS 6,809,481 B2 * 10/2004 Seo et al. .................. 315/169.1
7,462,897 B2 * 12/2008 Endo ............................ 257/291
8,208,086 B2 * 6/2012 Choi et al. ...................... 349/43
8,766,906 B2 * 7/2014 Yoshida et al. ............... 345/102

FOREIGN PATENT DOCUMENTS

KR 10-0887634 B1 3/2009
KR 10-2009-0122092 A 11/2009

* cited by examiner

LIQUID CRYSTAL DISPLAY

INCORPORATION BY REFERENCE TO ANY PRIORITY APPLICATIONS

A claim for priority under 35 U.S.C. §119 is made to Korean Patent Application No. 10-2014-0026703 filed Mar. 6, 2014, in the Korean Intellectual Property Office, the entire contents of which are hereby incorporated by reference.

BACKGROUND

1. Field

The described technology generally relates to a liquid crystal display.

2. Description of the Related Technology

Liquid crystal displays (LCDs) are widely used flat panel displays. LCDs include two display plates on which electrodes (hereinafter referred to as electric field generation electrodes) for generating an electric field are formed. A liquid crystal layer is interposed between the display plates. The transmittance of light passing through the liquid crystal layer is adjusted by applying a voltage between the electric field generation electrodes to generate an electric field such that liquid crystal molecules within the liquid crystal layer are rearranged.

SUMMARY OF CERTAIN INVENTIVE ASPECTS

One inventive aspect is a liquid crystal display capable of preventing static electricity.

Another aspect is a liquid crystal display comprising a first display substrate including gate lines, data lines isolated from and intersecting the gate lines, and a gate metal portion formed on the same layer as the gate lines; a second display substrate opposite to the first display substrate; a liquid crystal layer interposed between the first display substrate and the second display substrate; and a sealant interposed between the first display substrate and the second display substrate and configured to seal the liquid crystal layer and to be overlapped with the gate metal portion. The gate metal portion comprises a first gate metal; a second gate metal opposite to the first gate metal and spaced apart from the first gate metal; a third gate metal spaced apart from the first and second gate metals; a first diode connected between the first gate metal and the third gate metal; and a second diode connected between the second gate metal and the third gate metal.

The liquid crystal display further comprises a printed circuit board configured to control the first display substrate and the second display substrate and a flexible printed circuit board configured to electrically connect the first display substrate and the second display substrate.

The first and second gate metals are grounded, respectively. The first and second gate metals are connected to the flexible printed circuit board, respectively. The third gate metal is floated.

The first display substrate has a substantially rectangular shape that includes first and second edges extending a first direction and third and fourth edges perpendicular to the first direction, and the flexible printed circuit board is arranged to be overlapped with the first edge.

The sealant comprises a first sealant spaced apart from the first edge by a minimum distance; a second sealant spaced apart from the second edge by a minimum distance; a third sealant spaced apart from the third edge by a minimum distance; and a fourth sealant spaced apart from the fourth edge by a minimum distance.

The third metal gate covers a part of the second sealant.

The first gate metal covers the third sealant fully, and the second gate metal covers the fourth sealant fully.

The first display substrate comprises a display area and a non-display area surrounding the display area, and wherein the sealant and the gate metal portion are formed in the non-display area.

The liquid crystal display further comprises an antenna pattern overlapped with the third gate metal. The antenna pattern is formed on the second display substrate. The antenna pattern is formed in the non-display area.

Each of the first and second diodes is formed of a bi-directional diode. The bi-directional diode comprises at least one forward diode and at least one backward diode connected in parallel, and each of the forward diode and the backward diode is formed of a diode-connected transistor.

Another aspect is an LCD, comprising a first display substrate including a plurality of gate lines, a plurality of data lines crossing the gate lines, and a gate metal portion formed on the same layer as the gate lines; a second display substrate opposing the first display substrate; a liquid crystal layer interposed between the first and second display substrates; and a sealant interposed between the first and second display substrates and substantially sealing the liquid crystal layer, wherein the sealant substantially overlaps the gate metal portion, wherein the gate metal portion comprises: a first gate metal; a second gate metal opposing the first gate metal and spaced apart from the first gate metal; a third gate metal spaced apart from the first and second gate metals; a first diode electrically connecting the first gate metal to the third gate metal; and a second diode electrically connecting the second gate metal to the third gate metal.

The LCD can further comprise a printed circuit board configured to apply signals to the gate lines, the data lines, and the gate metal portion and a flexible printed circuit board electrically connecting the printed circuit board to the gate lines, the data lines, and the gate metal portion. The first and second gate metals can be grounded. The third gate metal can be floated. The first display substrate can have a substantially rectangular shape and includes first and second edges extending a first direction and third and fourth edges extending in a second direction substantially perpendicular to the first direction, wherein the flexible printed circuit board overlaps one of the first to fourth edges. The sealant can comprise a first sealant adjacent to and spaced apart from the first edge by at least a minimum distance; a second sealant adjacent to and spaced apart from the second edge by at least the minimum distance; a third sealant adjacent to and spaced apart from the third edge by at least the minimum distance; and a fourth sealant adjacent to and spaced apart from the fourth edge by at least the minimum distance. The third metal gate can overlap at least a portion of the second sealant. The first gate metal can completely overlap the third sealant and wherein the second gate metal completely overlaps the fourth sealant. The first display substrate can comprise a display area and a non-display area surrounding the display area and the sealant and the gate metal portion can be formed in the non-display area. The LCD can further comprise an antenna pattern overlapping the third gate metal. The antenna pattern can be formed over the second display substrate. The antenna pattern can be formed in the non-display area. Each of the first and second diodes can be a bi-directional diode. Each of the bi-directional diodes can comprise at least one forward diode and at least one backward diode connected in parallel. each of the forward diodes and each of the backward diodes can be a diode-connected transistor.

Another aspect is a display device, comprising first and second substrates opposing each other; a plurality of pixels formed over the first substrate; a plurality of signal lines formed over the first substrate and configured to apply signals to the pixels; a sealant surrounding the pixels and substantially sealing the first and second substrates; first, second, and third gate metal patterns formed over the first substrate and overlapping at least a portion of the sealant; a first diode electrically connecting the first gate metal pattern to the third gate metal pattern; a second diode electrically connecting the second gate metal pattern to the third gate metal pattern; and an antenna formed over the second substrate, wherein the third gate metal pattern at least partially overlaps the antenna.

The first, second, and third gate metal patterns can substantially surround the pixels. Each of the first and second diodes can be a bi-directional diode. The display device can further comprise a printed circuit board configured to i) drive the pixels and ii) apply a ground voltage to the first and second gate metal patterns, wherein the third metal pattern is configured to have a floating ground voltage. The antenna can be arranged so as to not overlap i) the first and second gate metal patterns and ii) the first and second diodes.

DETAILED DESCRIPTION OF CERTAIN INVENTIVE EMBODIMENTS

Figure 1:
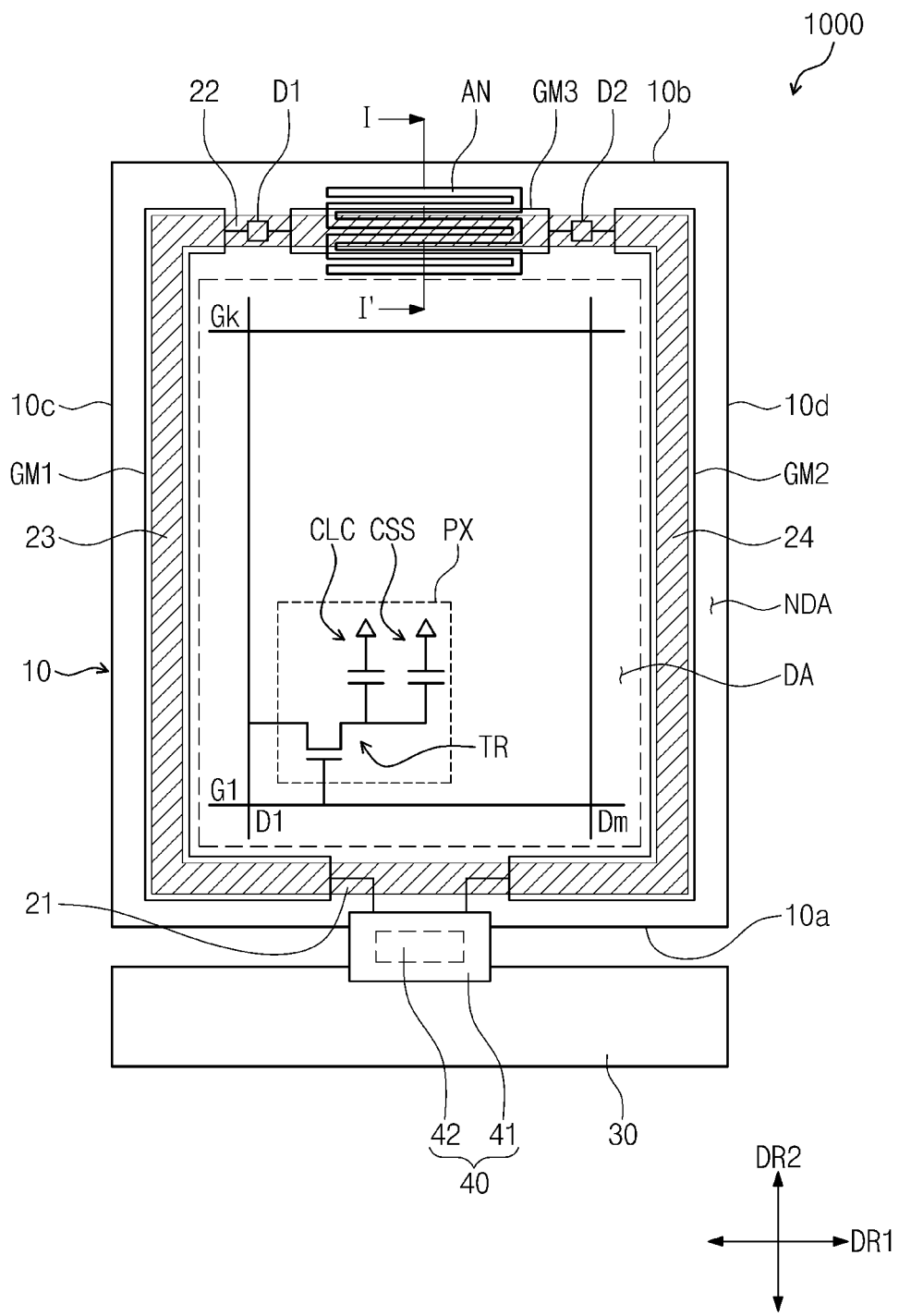
FIG. 1 is a plane view of a liquid crystal display according to an embodiment.

LCDs can include a metal electrode that overlaps a sealant in order to increase the hardening rate of the sealant. Static electricity can be produced if the metal electrode is floated, leading to damage of the peripheral circuitry. LCDs often also include a wireless communication terminal connected to an antenna pattern. The characteristics of the antenna pattern may deteriorate due to capacitive coupling with the metal electrodes.

Embodiments will be described in detail with reference to the accompanying drawings. The described technology, however, may be embodied in various different forms and should not be construed as being limited only to the illustrated embodiments. Rather, these embodiments are provided as examples so that this disclosure will be thorough and complete and will fully convey the concept of the described technology to those skilled in the art. Accordingly, known processes, elements, and techniques may not be described with respect to some of the embodiments. Unless otherwise noted, like reference numerals denote like elements throughout the attached drawings and written description and thus descriptions thereof will not be repeated. In the drawings, the sizes and relative sizes of layers and regions may be exaggerated for the sake of clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein are to be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the described technology. As used herein, the singular forms "a", "an" and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may also be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
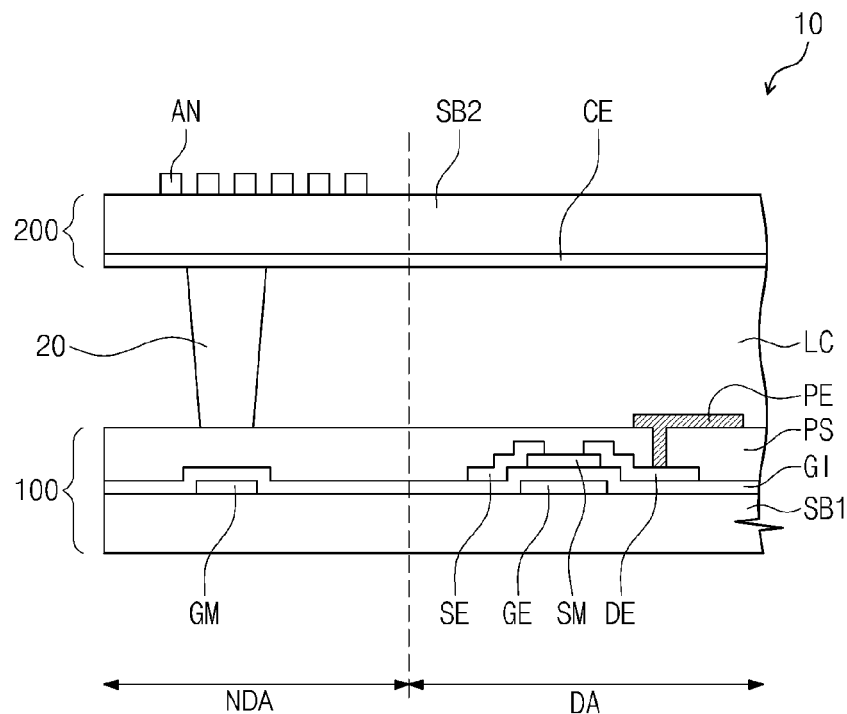
FIG. 2 is a cross-sectional view taken along line I-I' of FIG. 1.

FIG. 1 is a plane view of a liquid crystal display according to an embodiment. FIG. 2 is a cross-sectional view taken along line I-I' of FIG. 1.

Referring to FIGS. 1 and 2, a liquid crystal display 1000 includes a display panel 10, a printed circuit board 30, and a flexible printed circuit board 40.

The liquid crystal display panel 10 displays images. When viewed from above, the shape of the liquid crystal display panel 10 can be one of various shapes. Below, an embodiment of the liquid crystal display panel 10 having a substantially rectangular shape extending in a first direction DR1 and a second direction DR2 perpendicular to the first direction DR1 will be described. However, the described technology is not limited thereto.

The display panel 10 includes a first display substrate 100, a second display substrate 200, a liquid crystal layer LC, and a sealant 20.

The first display substrate 100 includes a display area DA and a non-display area NDA surrounding the display area DA. Images are displayed in the display area DA and images are not displayed in the non-display area NDA.

In the embodiment of FIGS. 1 and 2, the first display substrate 100 has a substantially square shape that includes first and second edges 10a and 10b extending in the first direction DR1 and third and fourth edges 10c and 10d extending in the second direction DR2.

The first display substrate 100 includes a plurality of gate lines G1 to Gk each receiving a gate signal and a plurality of data lines D1 to Dm each receiving a data voltage. The gate lines G1 to Gk and the data lines D1 to Dm are arranged to cross each other and are electrically insulated from each other at the intersections therebetween.

A plurality of pixel areas are defined in the display area DA and are arranged in a matrix between the gate lines G1 to Gk and the data lines D1 to Dm. A plurality of pixels are respectively provided at the pixel areas. FIG. 1 illustrates an equivalent circuit for one of the pixels PX. The pixel PX includes a thin film transistor TR, a liquid crystal capacitor CLC, and a storage capacitor CSS.

As shown in FIG. 2, thin film transistor TR has a gate electrode GE, a semiconductor pattern SM, a source electrode SE, and a drain electrode DE. The gate electrode GE is connected to one of the gate lines G1 to Gk. The source electrode SE is connected to one of the data lines D1 to Dm and the drain electrode DE is connected to the liquid crystal capacitor CLC and the storage capacitor CSS. The liquid crystal capacitor CLC and the storage capacitor CSS are connected in parallel to the drain electrode of the thin film transistor TR.

The first display substrate 100 includes a first insulation substrate SB1, a pixel electrode PE, and a gate metal portion GM.

The first insulation substrate SB1 may be formed of a transparent insulation material such as glass, plastic, ceramic, or the like.

The gate electrode GE is formed on the first insulation substrate SB1 and a gate insulation film GI is formed on the gate electrode GE. The semiconductor pattern SM is formed on the gate insulation film GI and the source electrode SE is connected to one end of the semiconductor pattern SM. The drain electrode DE is spaced apart from the source electrode SE and is connected to the other end of the semiconductor pattern SM. A passivation film PS is formed over the source electrode SE and the drain electrode DE. The passivation film PS has a contact hole CH exposing a portion of the drain electrode DE.

The pixel electrode PE is formed on the passivation film PS and is connected to the drain electrode DE through the contact hole CH. The pixel electrode PE functions as a first electrode of the liquid crystal capacitor CLC and receives a data voltage from a data line through the thin film transistor TR.

The gate metal portion GM is formed on the same layer as the gate lines G1 to Gk and the gate electrode GE. The gate metal portion GM may be formed within the non-display area NDA, which will be more fully described later.

The second display substrate 200 is arranged to be opposite to the first display substrate 100. The second display substrate 200 includes a second insulation substrate SB2 and a common electrode CE.

The second insulation substrate SB2 may be formed of a transparent insulation material such as glass, plastic, ceramic, or the like.

The common electrode CE is formed on the second insulation substrate SB2 and functions as a second electrode of the liquid crystal capacitor CLC. A constant common voltage is provided to the common electrode CE. In some embodiments, the common electrode CE is formed on the first display substrate 100 depending on the operating mode of the LCD, however, the described technology is not limited thereto. The liquid crystal layer LC may be controlled by a horizontal electric field formed when a voltage is applied between the pixel electrode PE and the common electrode.

Although not shown in figures, the second display substrate 200 may further comprise a shield layer, an overcoat layer, and/or a color filer.

The shield layer may be formed on the second insulation substrate SB2 to shield the LCD from incident light. The overcoat layer is formed on the shield layer to form a substantially planar a surface opposite to the first display substrate 100. The overcoat layer may be formed of an insulation material. The color filter may be formed between the overcoat layer and the shield layer. The color filter may filter light incident thereon to a predetermined color. The shield layer and the color filter is formed on the first display substrate 100 in some embodiments, however, the described technology is not limited thereto.

The liquid crystal layer LC is formed between the first display substrate 100 and the second display substrate 200. The liquid crystal layer LC includes a plurality of liquid crystal molecules. The arrangement of the liquid crystal molecules can be changed based on an electric field applied across the liquid crystal layer LC in order to select the transmittance of incident light.

The sealant 20 is interposed between the first and second display substrates 100 and 200 to seal the liquid crystal layer LC. The sealant 20 may be formed within the non-display area NDA and may overlap the gate metal portion GM.

The sealant 20 includes a first sealant 21, a second sealant 22, a third sealant 23, and a fourth sealant 24.

When viewed from the top, the first sealant 21 is spaced apart from the first edge 10a by a minimum distance, the second sealant 22 apart from the second edge 10b by a minimum distance, the third sealant 23 apart from the second edge 10c by a minimum distance, and the fourth sealant 24 apart from the second edge 10d by a minimum distance.

The sealant 20 may be formed of photopolymer or thermosetting material, such as epoxy resin. The first display substrate 100 and the second display substrate 200 are adhered to each other during a process of manufacturing the liquid crystal display 1000. At this time, the sealant 20 is hardened by radiating ultraviolet rays onto the sealant 20. The ultraviolet rays radiated onto the sealant 20 are reflected by the gate metal GM, thereby increasing the hardening rate of the sealant 20. The gate metal GM increases the hardening rate of the sealant 20 such that the adhesion strength between the first and second display substrates 100 and 200 increases. Thus, it is possible to improve impact resistance of the liquid crystal display 1000.

The flexible printed circuit board 40 electrically connects the display panel 10 and the printed circuit board 30. The flexible printed circuit board 40 includes a base film 41 and an integrated circuit chip 42 formed on the base film 41.

One end of the flexible printed circuit board 40 is bonded to the first display substrate 100 and overlaps the first edge 10a of the first display substrate 100 to be connected to the display panel 10. The other end of the flexible printed circuit board 40 is bonded and connected to the printed circuit board 30.

FIG. 1 illustrates a single flexible printed circuit board 40. However, the described technology is not limited thereto. For example, a plurality of flexible printed circuit boards may be provided spaced apart from one another.

The printed circuit board 30 drives the display panel 10. The printed circuit board 30 controls the first and second display substrates 100 and 200. The printed circuit board 30 may include a driving substrate (not shown) and a plurality of circuit parts (not shown) mounted on the driving substrate.

Although not shown in the figures, the liquid crystal display 1000 may further comprise a backlight unit arranged below the display panel 10. When included, the backlight unit provides light to the display panel 10.

The liquid crystal display 1000, although not shown in figures, may further comprise a pair of polarization plates opposing each other with the display panel 10 interposed between the polarization plates. The transmission axes of the polarization plates are orthogonal to each other.

The liquid crystal display 1000 further comprises an antenna pattern AN. The antenna pattern AN is formed to overlap a portion of the gate metal portion GM. The antenna pattern AN may be formed in the non-display area NDA.

In some embodiments, the antenna pattern AN is formed on the second display substrate 200, however, the described technology is not limited thereto. When the antenna pattern AN overlaps the gate metal portion GM, it may be formed on the second display substrate 200. The antenna pattern AN has a unique frequency band and is used for wireless communications with an external device.

Figure 3:
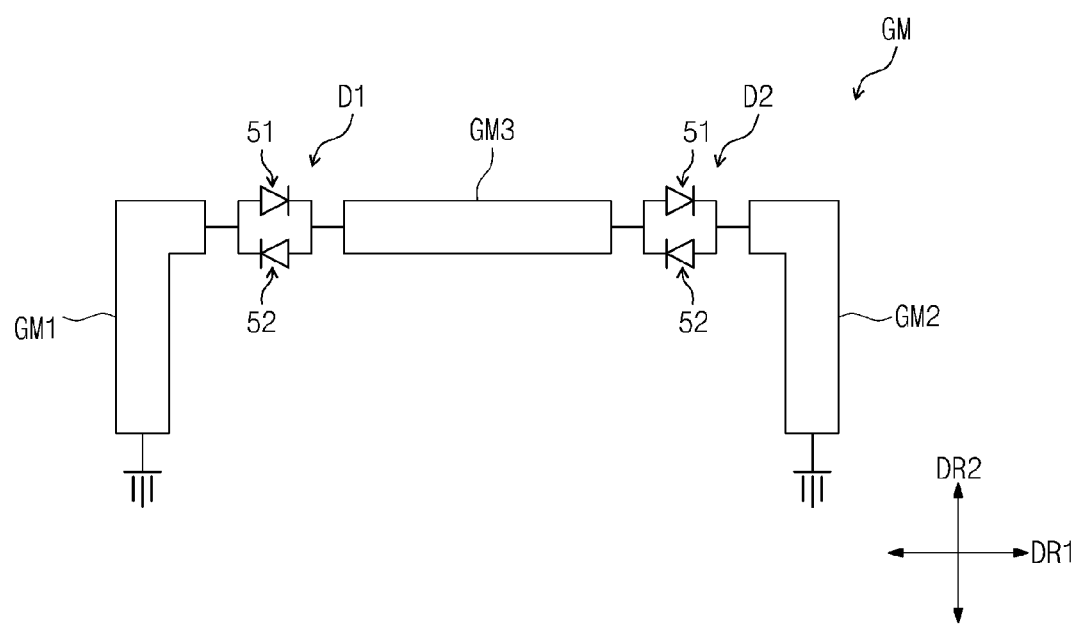
FIG. 3 is an expanded plane view of a gate metal portion shown in FIG. 1.

FIG. 3 is an expanded plane view of the gate metal portion shown in FIG. 1.

The gate metal portion GM will be more fully described below with reference to FIGS. 1 to 3.

The gate metal portion GM includes a first gate metal GM1, a second gate metal GM2, a third gate metal GM3, a first diode D1, and a second diode D2.

The first gate metal GM1 substantially completely covers the third sealant 23. The first gate metal GM1 has a first portion that extends in the second direction DR2 and second portions that in the first direction DR1 from ends of the first portion. The second portions of the first gate metal GM1 partially cover each of the first sealant 21 and the second sealant 22.

The first gate metal GM1 is grounded. The first gate metal GM1 is connected to a flexible printed circuit board 40 and receives a ground signal therefrom.

The second gate metal GM2 is formed on an opposite side of the LCD from the first gate metal GM1 and is spaced apart from the first gate metal GM1. The second gate metal GM2 substantially completely covers the fourth sealant 24. The second gate metal GM2 has a first portion that extends in the second direction DR2 and second portions that extend in the first direction DR1 from ends of the first portion. The second portions of the second gate metal GM2 partially cover the first sealant 21 and the second sealant 22.

The second gate metal GM2 is also grounded. The second gate metal GM2 is connected to a flexible printed circuit board 40 and receives a ground signal therefrom.

The third gate metal GM3 is spaced apart from the first and second gate metals GM1 and GM2. The third gate metal GM3 partially covers the second sealant 22.

The third gate metal GM3 is floated. The antenna pattern AN overlaps the third gate metal GM3. If the third gate metal GM3 is not floated, the characteristics of the antenna pattern AN may deteriorate due to a parasitic capacitor formed between the antenna pattern AN and the third gate metal GM3 and signals applied to the third gate metal GM3.

The first diode D1 is connected between the first gate metal GM1 and the third gate metal GM3.

The second diode D2 is connected between the second gate metal GM2 and the third gate metal GM3.

Each of the first and second diodes D1 and D2 may be formed as bi-directional diodes, which includes at least one forward diode 51 and at least one backward diode 52 connected in parallel. FIG. 3 illustrates an example where each of the first and second diodes D1 and D2 includes at least one forward diode 51 and at least one backward diode 52 connected in parallel.

If the first and second didoes D1 and D2 are not provided, the third metal line GM3 may still be floated. In these situations, the performance of the antenna pattern AN is not lowered, but static electricity is produced. Peripheral circuitry is affected by the static electricity produced from the third gate metal GM3. According to at least one embodiment, the liquid crystal display 1000 improves the performance of the antenna pattern AN through the floating third gate metal GM3 and also prevents static electricity from being generated at the third gate metal GM3 using the first and second diodes D1 and D2.

Figure 4:
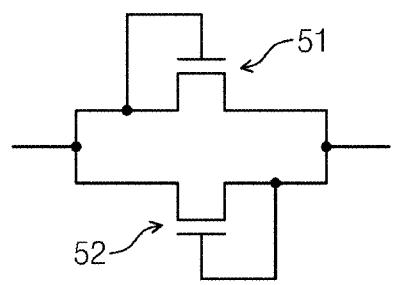
FIG. 4 is a circuit diagram schematically illustrating one of first and second diodes shown in FIG. 3.

FIG. 4 is a circuit diagram schematically illustrating an embodiment of one of first and second diodes shown in FIG. 3.

Referring to FIGS. 3 and 4, each of first and second diodes D1 and D2 is formed of diode-connected transistors. That is, a forward diode 51 and a backward diode 52 are each formed of a diode-connected transistor. Each of the diode-connected transistors is formed by manufacturing a thin film transistor TR and connecting the gate to one of the source and drain electrodes as shown in FIG. 4.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A liquid crystal display (LCD), comprising:
   a first display substrate including a plurality of gate lines, a plurality of data lines crossing the plurality of gate lines, and a gate metal portion formed on the same layer as the plurality of gate lines;
   a second display substrate opposing the first display substrate;
   a liquid crystal layer interposed between the first and second display substrates; and
   a sealant interposed between the first and second display substrates and substantially sealing the liquid crystal layer, wherein the sealant substantially overlaps the gate metal portion,
   wherein the gate metal portion comprises:
      a first gate metal;
      a second gate metal opposing the first gate metal and spaced apart from the first gate metal;
      a third gate metal spaced apart from the first and second gate metals;
      a first diode electrically connecting the first gate metal to the third gate metal; and
      a second diode electrically connecting the second gate metal to the third gate metal.

2. The LCD of claim 1, further comprising:
- a printed circuit board configured to apply signals to the plurality of gate lines, the plurality of data lines, and the gate metal portion; and
- a flexible printed circuit board electrically connecting the printed circuit board to the plurality of gate lines, the plurality of data lines, and the gate metal portion.

3. The LCD of claim 2, wherein the first and second gate metals are grounded.

4. The LCD of claim 2, wherein the third gate metal is floated.

5. The LCD of claim 2, wherein the first display substrate has a substantially rectangular shape and includes first and second edges extending a first direction and third and fourth edges extending in a second direction substantially perpendicular to the first direction and wherein the flexible printed circuit board overlaps one of the first to fourth edges.

6. The LCD of claim 5, wherein the sealant comprises:
- a first sealant adjacent to and spaced apart from the first edge by at least a minimum distance;
- a second sealant adjacent to and spaced apart from the second edge by at least the minimum distance;
- a third sealant adjacent to and spaced apart from the third edge by at least the minimum distance; and
- a fourth sealant adjacent to and spaced apart from the fourth edge by at least the minimum distance.

7. The LCD of claim 6, wherein the third metal gate overlaps at least a portion of the second sealant.

8. The LCD of claim 7, wherein the first gate metal completely overlaps the third sealant and wherein the second gate metal completely overlaps the fourth sealant.

9. The LCD of claim 1, wherein the first display substrate comprises a display area and a non-display area surrounding the display area and wherein the sealant and the gate metal portion are formed in the non-display area.

10. The LCD of claim 9, further comprising an antenna pattern overlapping the third gate metal.

11. The LCD of claim 10, wherein the antenna pattern is formed over the second display substrate.

12. The LCD of claim 11, wherein the antenna pattern is formed in the non-display area.

13. The LCD of claim 1, wherein each of the first and second diodes is a bi-directional diode.

14. The LCD of claim 13, wherein each of the bi-directional diodes comprises at least one forward diode and at least one backward diode connected in parallel.

15. The LCD of claim 14, wherein each of the forward diodes and each of the backward diodes is a diode-connected transistor.

16. A display device, comprising:
- first and second substrates opposing each other;
- a plurality of pixels formed over the first substrate;
- a plurality of signal lines formed over the first substrate and configured to apply signals to the plurality of pixels;
- a sealant surrounding the plurality of pixels and substantially sealing the first and second substrates;
- first, second, and third gate metal patterns formed over the first substrate and overlapping at least a portion of the sealant;
- a first diode electrically connecting the first gate metal pattern to the third gate metal pattern;
- a second diode electrically connecting the second gate metal pattern to the third gate metal pattern; and
- an antenna formed over the second substrate,
- wherein the third gate metal pattern at least partially overlaps the antenna.

17. The display device of claim 16, wherein the first, second, and third gate metal patterns substantially surround the plurality of pixels.

18. The display device of claim 16, wherein each of the first and second diodes is a bi-directional diode.

19. The display device of claim 16, further comprising a printed circuit board configured to i) drive the plurality of pixels and ii) apply a ground voltage to the first and second gate metal patterns, wherein the third metal pattern is configured to have a floating ground voltage.

20. The display device of claim 16, wherein the antenna does not overlap i) the first and second gate metal patterns and ii) the first and second diodes.

* * * * *